United States Patent
Kurosawa et al.

(10) Patent No.: US 11,404,101 B2
(45) Date of Patent: Aug. 2, 2022

(54) MEMORY SYSTEM AND SEMICONDUCTOR STORAGE DEVICE CONFIGURED TO DISCHARGE WORD LINE DURING ABRUPT POWER INTERRUPT

(71) Applicant: Kioxia Corporation, Tokyo (JP)

(72) Inventors: Takehisa Kurosawa, Kanagawa (JP); Yusuke Tanefusa, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/160,885

(22) Filed: Jan. 28, 2021

(65) Prior Publication Data
US 2021/0241812 A1 Aug. 5, 2021

(30) Foreign Application Priority Data

Jan. 30, 2020 (JP) .............................. JP2020-013313

(51) Int. Cl.
*G11C 11/4074* (2006.01)
*G11C 11/411* (2006.01)
*G11C 11/409* (2006.01)
*G11C 11/408* (2006.01)

(52) U.S. Cl.
CPC ........ *G11C 11/4074* (2013.01); *G11C 11/409* (2013.01); *G11C 11/4085* (2013.01); *G11C 11/4113* (2013.01)

(58) Field of Classification Search
None
See application file for complete search history.

(56) References Cited

U.S. PATENT DOCUMENTS

| | | | |
|---|---|---|---|
| 7,630,244 B2 | 12/2009 | Lee | |
| 8,116,145 B2 | 2/2012 | Cheng et al. | |
| 8,233,346 B2 | 7/2012 | Hirota | |
| 9,786,371 B1 * | 10/2017 | Lee | G11C 7/20 |
| 9,899,065 B1 * | 2/2018 | Lee | G11C 7/20 |
| 2011/0031811 A1 * | 2/2011 | Park | H02J 7/345 307/66 |
| 2012/0062187 A1 * | 3/2012 | Shim | H02H 3/10 320/167 |
| 2012/0099392 A1 * | 4/2012 | Shim | G11C 5/147 365/226 |
| 2012/0102310 A1 * | 4/2012 | Shim | G11C 16/22 713/2 |
| 2017/0011780 A1 * | 1/2017 | Kim | H03K 17/223 |

* cited by examiner

*Primary Examiner* — J. H. Hur
(74) *Attorney, Agent, or Firm* — Foley & Lardner LLP

(57) ABSTRACT

A memory system includes a semiconductor storage device, a power supply circuit that generates a first power, and a memory controller that operates based on the first power and transmits a command to the semiconductor storage device. The semiconductor storage device includes a first terminal, a second terminal, a word line, a first circuit, and a second circuit. The first power is input to the first terminal. A second power that can be used even after a voltage of the first terminal decreases is input to the second terminal. The word line is connected to a control gate of a memory cell transistor. The first circuit applies a voltage according to the command to the word line based on the first power input to the first terminal. The second circuit discharges charges of the word line by using the second power input to the second terminal when a voltage of the first terminal decreases.

4 Claims, 9 Drawing Sheets

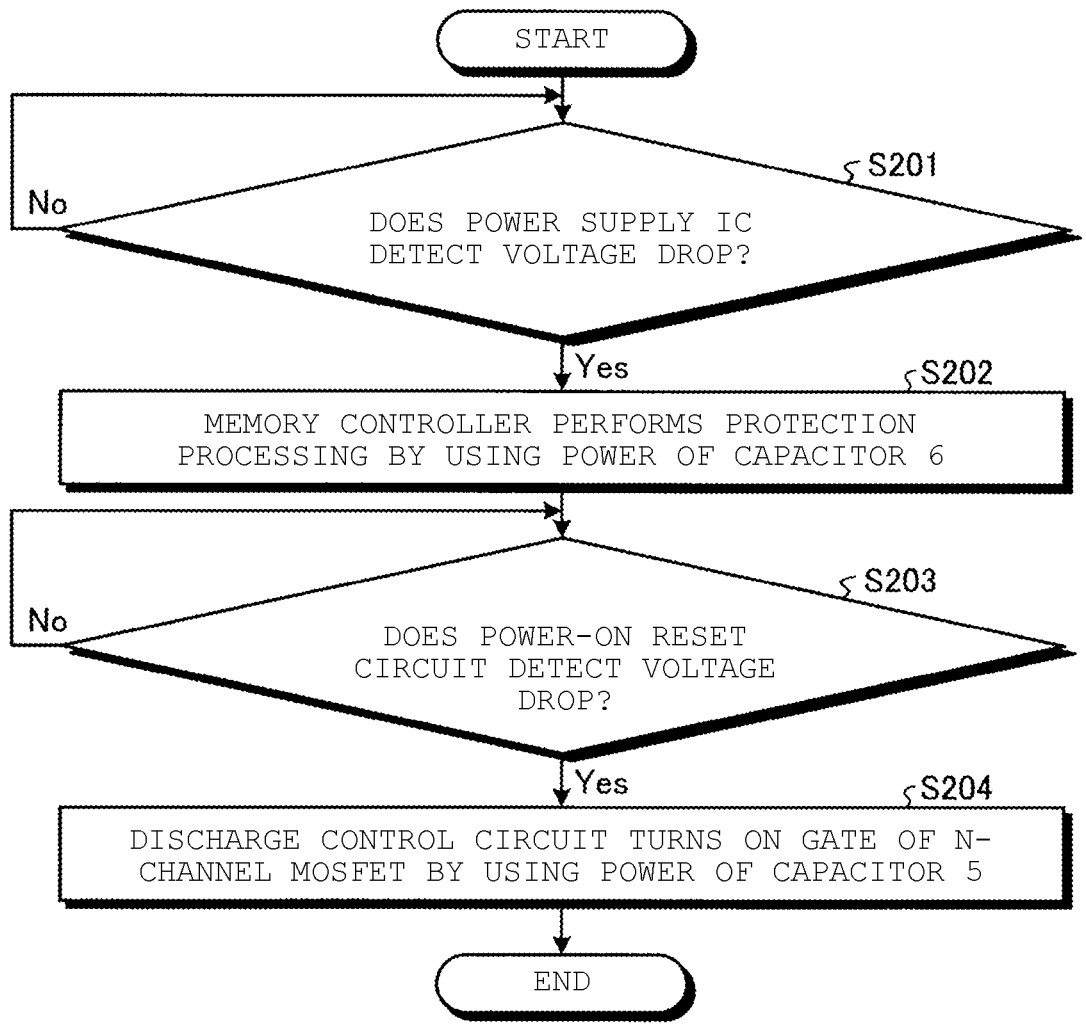

MEMORY SYSTEM AND SEMICONDUCTOR STORAGE DEVICE CONFIGURED TO DISCHARGE WORD LINE DURING ABRUPT POWER INTERRUPT

CROSS-REFERENCE IO RELATED APPLICATION

This application is based upon and claims the benefit of priority from. Japanese Patent Application No. 2020-013313, filed on Jan. 30, 2020, the entire contents of which are incorporated herein by reference.

FIELD

Embodiments described herein relate generally to a memory system and a semiconductor storage device.

BACKGROUND

In the related art, there have been known semiconductor storage devices such as NAND flash memories. In order to prevent alteration of data already written in the NAND flash memory, the NAND flash memory is required to be power interrupted in a state where charges in a word line are discharged. However, during abrupt power interrupt (abrupt shutdown), the discharging may not be completed.

DESCRIPTION OF THE DRAWINGS

FIG. 11 is a flowchart showing an example of operations of the memory system according to the third embodiment.

DETAILED DESCRIPTION

At least one embodiment provides a memory system and a semiconductor storage device capable of discharging charges remaining on a word line even during abrupt power interrupt.

In general, according to at least one embodiment, a memory system includes a semiconductor storage device, a power supply circuit that generates a first power, and a memory controller that operates based on the first power and transmits a command to the semiconductor storage device. The semiconductor storage device includes a first terminal, a second terminal, a word line, a first circuit, and a second circuit. The first power is input to the first terminal. A second power that can be used even after a voltage of the first terminal drops is input to the second terminal. The word line is connected to a control gate of a memory cell transistor. The first circuit applies a voltage according to the command to the word line based on the first power input to the first terminal. The second circuit discharges charges of the word line by using the second power input to the second terminal when a voltage of the first terminal drops (decreases).

Hereinafter, a memory system and a semiconductor storage device according to at least one embodiment will be described in detail with reference to the accompanying drawings. In addition, the present disclosure is not limited to these embodiments.

First Embodiment

Figure 1:
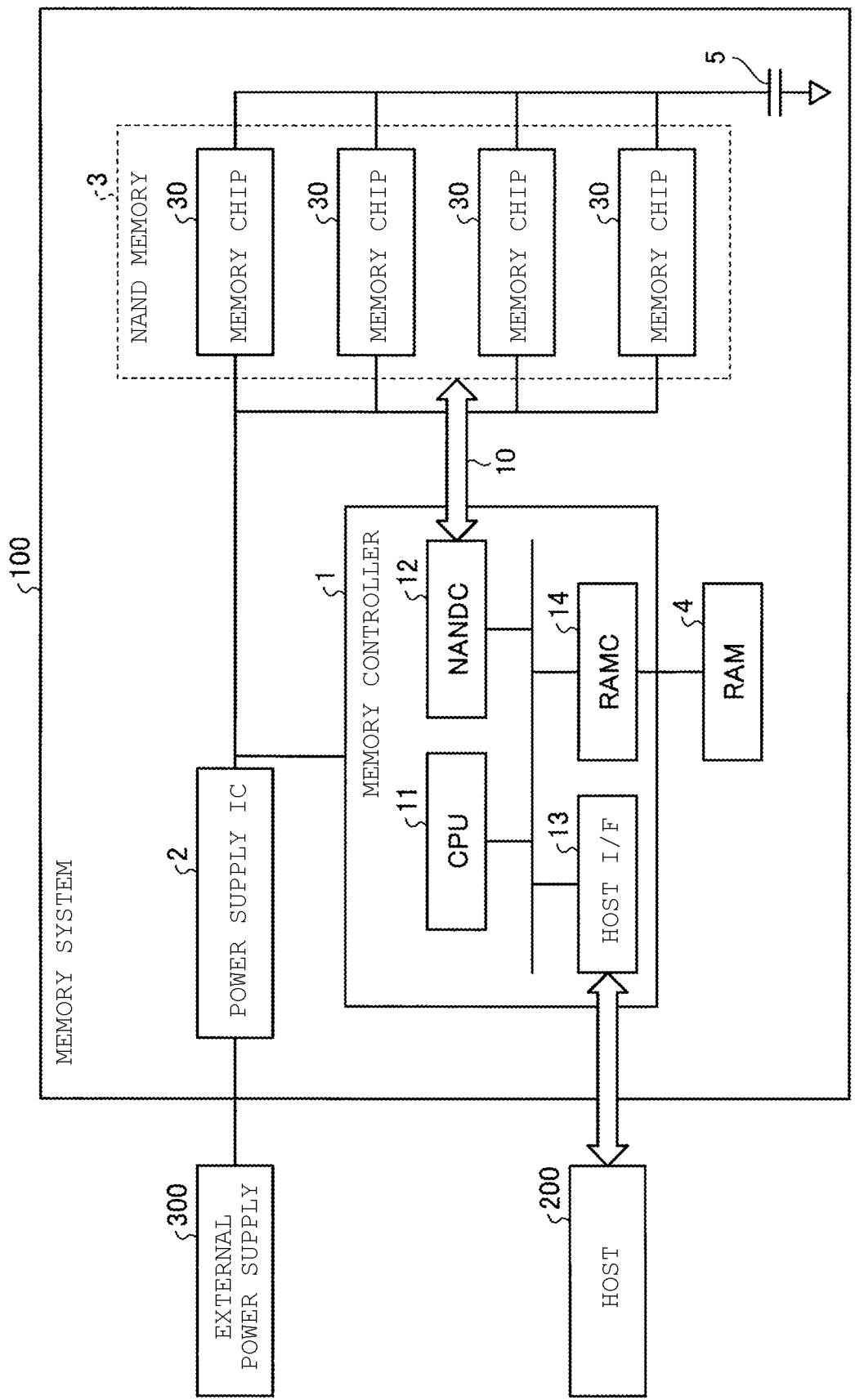
FIG. 1 is a schematic diagram showing an example of a configuration of a memory system according to a first embodiment.

FIG. 1 is a schematic diagram showing an example of a configuration of a memory system according to a first embodiment. As shown in FIG. 1, a memory system 100 is connected to a host 200 by a predetermined communication interface. The host 200 corresponds to, for example, a personal computer, a personal digital assistant, a server, or the like. The memory system 100 is able to receive various requests from the host 200. In addition, the memory system 100 is connected to an external power supply 300 and receives a power supplied from the external power supply 300.

The memory system 100 includes a memory controller 1, a power supply Integrated Circuit (IC) 2, a NAND flash memory (NAND memory) 3, a Random Access Memory (RAM) 4, and a capacitor 5. The power supply IC 2 corresponds to a power supply circuitry. The capacitor 5 corresponds to a first capacitor.

The power supply IC 2 generates a power for driving the memory controller 1, the NAND memory 3, and the RAM 4 based on the power input from the external power supply 300. And, the power supply IC 2 supplies the generated power to the memory controller 1, the NAND memory 3, and the RAM 4. The power input from the external power supply 300 to the power supply IC 2 corresponds to a third power. In addition, the power generated by the power supply IC 2 for driving the memory controller 1, the NAND memory 3, and the RAM 4 corresponds to a first power.

The memory controller 1 executes various processes including data transferring between the host 200 and the NAND memory 3. As a configuration for that purpose, the memory controller 1 includes a Central Processing Unit (CPU) 11, a NANDC (NAND Controller) 12, a host Interface (I/F) 13, and a RAM Controller (RAMC) 14.

The CPU 11 controls the entire memory controller 1 based on a firmware program. Based on an instruction from the CPU 11, the NANDC 12 transmits a command for performing access (data write, data read, and data erase) to the NAND memory 3 to a target memory chip 30 or performs data transmitting and receiving corresponding to the command to and from the memory chip 30. A host I/F 13 transmits and receives information such as data and requests to and from the host 200. A RAMC 14 executes access (data write, data read, and data erase) to the RAM 4.

The RAM 4 provides the memory controller 1 with an area as a buffer or a cache. For example, the memory controller 1 may use the RAM 4 as a buffer for data transferred between the host 200 and the NAND memory 3 or may use the RAM as an area for temporarily storing various management information such as logical-to-physical address conversion information. In addition, the logical-to-physical address conversion information is information that records correspondence between a logical address used by the host 200 to specify a position of the data and a physical address indicating a position in which the data is stored in the NAND memory 3.

The NAND memory 3 is configured with one or more memory chips 30. In the example of FIG. 1, the NAND memory 3 is configured with four memory chips 30. Each memory chip 30 corresponds to a semiconductor storage device.

Although shown in FIG. 1 in a simplified manner, each of the four memory chips 30 is connected to the memory controller 1 by a wiring group 10 including an IO signal line and a control signal line. The IO signal line is, for example, a signal line for transmitting and receiving data, addresses, and commands. The control signal line is, for example, a signal line for transmitting and receiving a write enable (WE) signal, a read enable (RE) signal, a command latch enable (CLE) signal, an address latch enable (ALE) signal, a write protect (WP) signal, and the like.

The connection relationship between the memory controller 1 and the four memory chips 30 may be selected freely. For example, one end of the wiring group 10 may be connected to the memory controller 1, the other end of the wiring group 10 may be branched into a plurality of (for example, two or four) branch destinations, and different memory chips 30 may be connected to the respective branch destinations. Alternatively, one end of the four sets of wiring groups 10 may be connected to the memory controller 1, and different memory chips 30 may be connected to the other ends of the respective four sets of wiring groups 10.

Each of the four memory chips 30 is able to receive a power input from the power supply IC 2.

In addition, each of the four memory chips 30 is connected to one capacitor 5. During the operation of the memory system 100, the capacitor 5 is charged, and the capacitor 5 is in a state where a predetermined amount of power is stored. And, during the power interrupt, the power stored in the capacitor 5 is used to control the discharging of the charges remaining on the word line.

In addition, the connection relationship between the memory chip 30 and the capacitor 5 shown in FIG. 1 is an example. For example, the memory system 100 includes four capacitors 5, and each of the four memory chips 30 may be connected one-to-one with any of the four capacitors 5. Alternatively, the memory system 100 may include two capacitors 5, and two memory chips 30 may be connected to each of the two capacitors 5. In this manner, the connection relationship between the memory chip 30 and the capacitor 5 may be changed freely.

The role of the capacitor 5 and the control of discharging of the charges remaining on the word line will be described in detail later.

Figure 2:
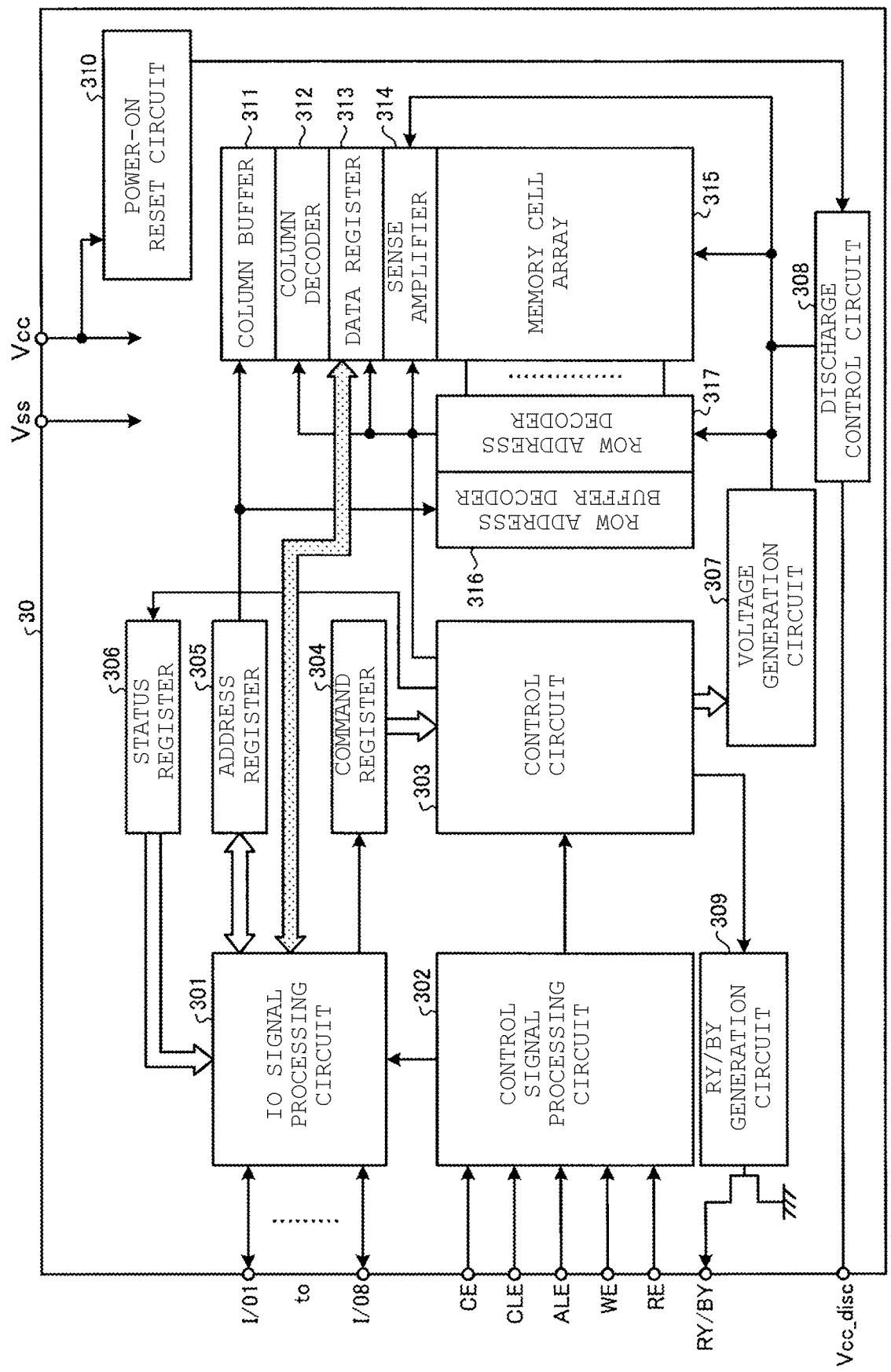
FIG. 2 is a schematic block diagram showing a configuration of each memory chip according to the first embodiment.

FIG. 2 is a schematic block diagram showing the configuration of each memory chip 30 according to the first embodiment.

The memory chip 30 includes an IO signal processing circuit 301, a control signal processing circuit 302, a control circuit 303, a command register 304, an address register 305, a status register 306, a voltage generation circuit 307, a discharge control circuit 308, an RY/BY generation circuit 309, a power-on reset circuit 310, a column buffer 311, a column decoder 312, a data register 313, a sense amplifier 314, a memory cell array 315, a row address buffer decoder 316, and a row address decoder 317.

In addition, the memory chip 30 includes a Vcc terminal to which a power is input from the power supply IC 2 and a Vss terminal to which a ground potential is connected. The power input to the Vcc terminal is supplied to each of circuit blocks excluding the discharge control circuit 308.

The power-on reset circuit 310 is connected to the Vcc terminal. When the power-on reset circuit 310 detects a rise in voltage of the Vcc terminal, the power-on reset circuit 310 resets each circuit block. In addition, when the power-on reset circuit 310 detects a voltage drop of the Vcc terminal, the power-on reset circuit 310 transmits a predetermined signal to the discharge control circuit 308.

In addition, a method of detecting the voltage drop of the Vcc terminal is not limited. In one example, the power-on reset circuit 310 may determine that the voltage of the Vcc terminal drops when the voltage of the Vcc terminal falls below a predetermined threshold voltage. The threshold voltage is set based on, for example, a minimum value of the voltage required for operations of the memory chip 30.

The control signal processing circuit 302 receives a control signal and determines whether an IO signal transmitted to the IO signal processing circuit 301 is a command, an address, or data based on the received control signal. In addition, the control signal processing circuit 302 transfers the received control signal to the control circuit 303.

The IO signal processing circuit 301 is a buffer circuit for transmitting and receiving the IO signal to and from the memory controller 1 via the IO signal line. The IO signal processing circuit 301 distributes and stores the commands, addresses, and data transmitted as the IO signals in the command register 304, the address register 305, and the data register 313, respectively.

The address stored in the address register 305 includes a row address and a column address. The row address is transmitted to the row address buffer decoder 316, and the column address is transmitted to the column buffer 311.

The control circuit 303 is a state transition circuit (state machine) that performs state transition based on various control signals received via the control signal processing circuit 302. The control circuit 303 controls the entire operations of the memory chip 30 based on various control signals and commands stored in the command register 304.

In addition, the control circuit 303 generates status information indicating an operation control state, an operation control result, or the like and stores the status information in the status register 306. The control circuit 303 is arranged to output the status information stored in the status register 306 via the IO signal processing circuit 301 in response to a status read command from the memory controller 1 or the like.

The RY/BY generation circuit 309 transitions a state of an RY/BY signal line between a ready state (RY) and a busy state (BY) under the control of the control circuit 303.

The memory cell array 315 has a configuration in which a plurality of memory cell transistors are arranged. The data received from the host 2 are stored in the memory cell array 315.

Figure 3:
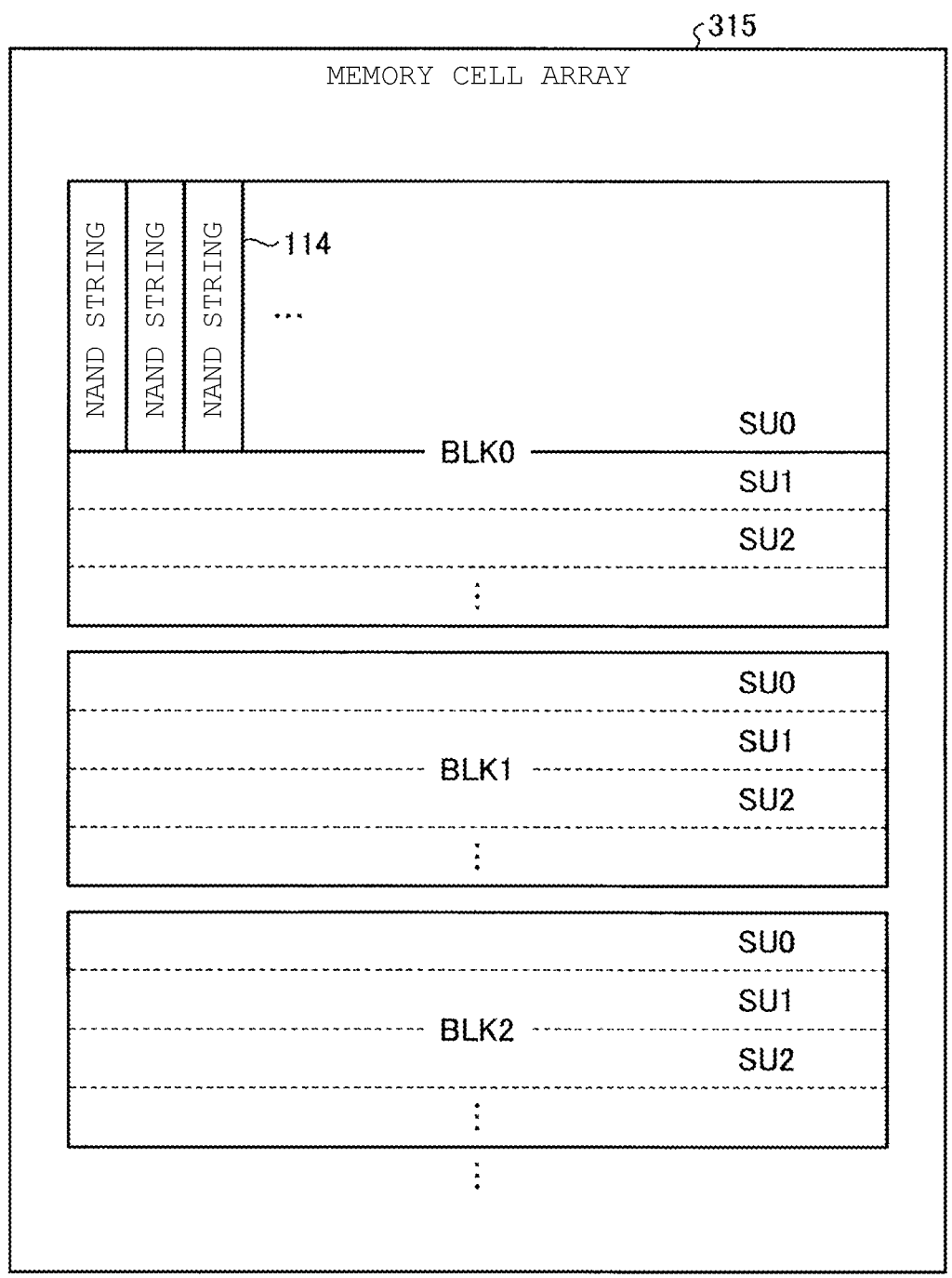
FIG. 3 is a schematic diagram showing a configuration example of a memory cell array according to the first embodiment.

FIG. 3 is a schematic diagram showing a configuration example of the memory cell array 315 according to the first embodiment. As shown in this figure, the memory cell array 315 includes a plurality of blocks BLK (BLK0, BLK1, . . . ), each of which is a set including a plurality of non-volatile memory cell transistors. Each block BLK includes a plurality of string units SU (SU0, SU1, . . . ), each of which is a set including memory cell transistors associated with a word line and a bit line. Each of the string units SU includes a plurality of NAND strings 114 in which memory cell transistors are connected in series. In addition, the number of NAND strings 114 in the string unit SU may be selected freely.

Figure 4:
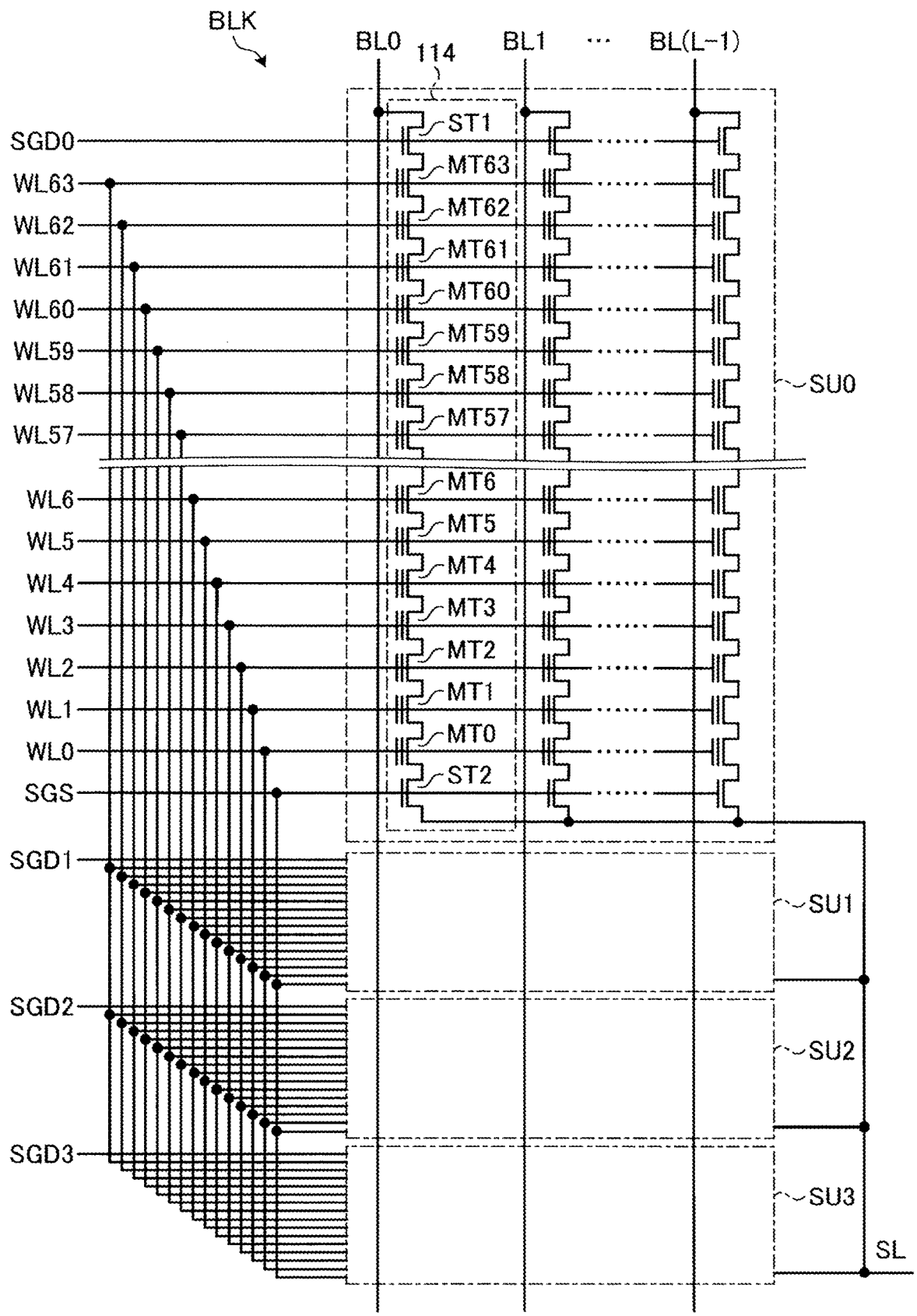
FIG. 4 is a schematic diagram showing a circuit configuration of a block BLK according to the first embodiment.

FIG. 4 is a schematic diagram showing a circuit configuration of the block BLK according to the first embodiment. In addition, each block BLK has the same configuration. The block BLK has, for example, four string units SU0 to SU3. Each string unit SU includes a plurality of NAND strings 114.

Each of the NAND strings 114 includes, for example, 64 memory cell transistors MT (MT0 to MT63) and select transistors ST1 and ST2. The memory cell transistor MT includes a control gate and a charge storage layer to store data non-volatilely. The 64 memory cell transistors MT (MT0 to MT63) are connected in series between the source of the select transistor ST1 and the drain of the select transistor ST2. The memory cell transistor MT may be of an MONOS type in which an insulating film is used for the charge storage layer, or may be of an FG type in which a conductive film is used for the charge storage layer. Further, the number of memory cell transistors MT in the NAND string 114 is not limited to 64, and other numbers are contemplated.

The gates of the select transistors ST1 in each of the string units SU0 to SU3 are connected to select gate lines SGD0 to SGD3, respectively. On the contrary, the gates of the select transistors ST2 in each of the string units SU0 to SU3 are commonly connected to, for example, select gate lines SGS. The gates of the select transistors ST2 in each of the string units SU0 to SU3 may be connected to different select gate lines SGS0 to SGS3 for each string unit SU. The control gates of the memory cell transistors MT0 to MT63 in the same block BLK are commonly connected to word lines WL0 to WL63, respectively.

The drains of the select transistors ST1 of each NAND string 114 in the string unit SU are connected to different bit lines BL (BL0 to BL(L-1)), where L is a natural number of 2 or more). In addition, the bit line BL commonly connects one NAND string 114 in each string unit SU between the plurality of blocks BLK. Further, the source of each select transistor ST2 is commonly connected to the source line SL.

That is, the string unit SU is a set including NAND strings 114 that are connected to different bit lines BL and connected to the same select gate lines SGD. In addition, the block BLK is a set including a plurality of the string units SU having a common word line WL. And, the NAND string 114 is a set including a plurality of the blocks BLK having a common bit line BL.

Data write and data read may be collectively executed for the memory cell transistors MT connected to one word line WL in one string unit SU. In addition, data erase may be executed in units of one block BLK.

In addition, the configuration of the memory cell array 315 described with reference to FIGS. 2 and 3 is merely an example. The configuration of the memory cell array 315 is not limited to the configuration described with reference to FIGS. 2 and 3. Hereinafter, the memory cell transistor will be represented as a memory cell.

The description is returned to FIG. 2. The voltage generation circuit 307 generates various voltages required for accessing (data write, data read, and data erase) to the memory cell array 315 based on the power input to the Vcc terminal.

The row address decoder 317, the column decoder 312, and the sense amplifier 314 execute access (data write, data read, and data erase) to the memory cell array 315 based on the control by the control circuit 303. In addition, the control circuit 303, the voltage generation circuit 307, and the row address decoder 317 correspond to the first circuit that applies a voltage according to a command to the word line.

For example, during the data write, the column decoder 312 selects the bit line BL corresponding to the column address stored in the column buffer 311. The control circuit 303 sets the potential of the selected bit line to zero. The row address decoder 317 selects the word line corresponding to the row address stored in the row address buffer decoder 316 and applies a high voltage pulse generated by the voltage generation circuit 307 to the selected word line. Then, electrons are injected into the charge storage layer of the memory cell located at the intersection of the selected bit line and the selected word line, and as a result, the threshold voltage of the memory cell rises. The sense amplifier 314 performs data read at a predetermined timing to check whether or not the threshold voltage of the memory cell reaches a target state corresponding to the data stored in the data register 313. The control circuit 303 continues applying the pulse to the row address decoder 317 until the threshold voltage of the memory cell reaches the target state.

During the data read, the sense amplifier 314 precharges the bit line BL with a voltage Vcc. The row address decoder 317 selects the word line corresponding to the row address stored in the row address buffer decoder 316. The row address decoder 317 allows the memory cell belonging to the non-selected word line to be in a conducted state by applying a predetermined voltage Vread generated by the voltage generation circuit 307 to the word line. Then, the row address decoder 317 sequentially applies a plurality of types of voltages generated by the voltage generation circuit 307 corresponding to types of pages to be read to the selected word line. The sense amplifier 314 determines the data corresponding to the state to which the target memory cell belongs by specifying the voltage that causes the outflow of the charges stored by precharging to the source line. The sense amplifier 314 stores the data obtained by the determination in the data register 313. The data stored in the data register 313 is transmitted to the IO signal processing circuit 301 through the data line and is transferred from the IO signal processing circuit 301 to the memory controller 1.

In this manner, various voltages are applied to the word line during the write into to or read from the memory cell array 315. That is, during the write into to or read from the memory cell array 315, the word line is charged with charges. If these charges remain on the word line even after the power is interrupted, the charges may cause fluctuations in the threshold voltage of the memory cell, and there is a concern that the data written in the memory cell may not be read correctly. Therefore, it is required to discharge the charges remaining on the word line before the operation is stopped.

In such a case where abrupt power interrupt occurs in a state where a voltage is applied to the word line, however, even when discharging is started in the memory chip 30 immediately after the voltage drop of the Vcc terminal is detected, the discharging may not be completed because the power supplied to the memory chip 30 is exhausted before the discharging is completed. The fact that the memory chip 30 is provided with many word lines in order to increase the storage capacity per memory chip 30 is also one of the factors that make it difficult to complete the discharging.

Therefore, according to the first embodiment, the memory chip 30 is provided with a Vcc_disc terminal to which another power that can be used even after the voltage of the Vcc terminal drops is input in addition to the Vcc terminal that receives the power input from the power supply IC 2. And, discharge control circuit 308 is configured so as to perform discharging the charges remaining on the word line based on the power input from the Vcc_disc terminal when the discharge control circuit 308 receives the signal transmitted if the power-on reset circuit 310 detects the voltage drop of the Vcc terminal. The discharge control circuit 308 corresponds to a second circuit.

Figure 5:
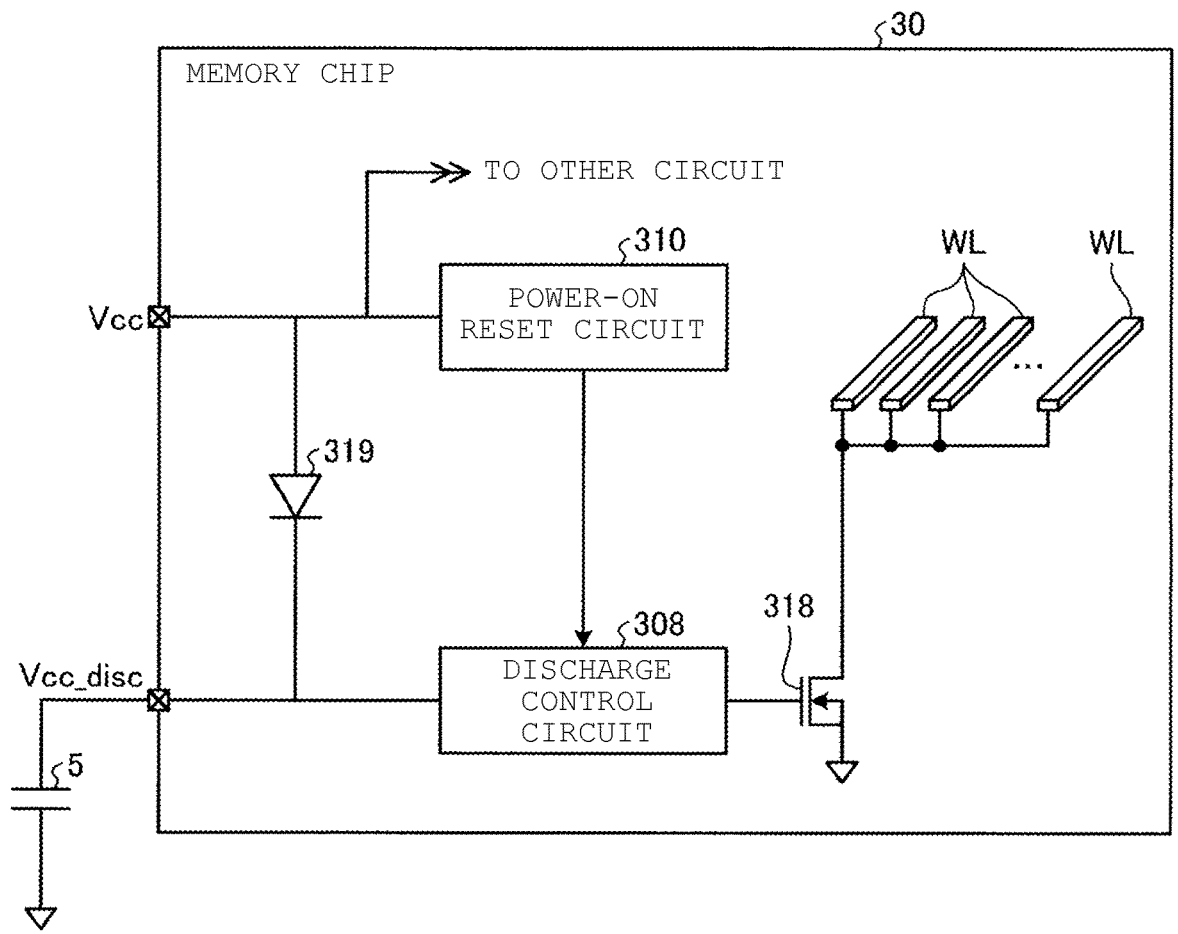
FIG. 5 is a schematic diagram showing an example of a more detailed configuration for discharging charges remaining on a word line according to the first embodiment.

FIG. 5 is a schematic diagram showing an example of a more detailed configuration for discharging the charges remaining on the word line according to the first embodiment.

As shown in FIG. 5, the wiring connecting the Vcc terminal, the power-on reset circuit 310, the wiring connecting the Vcc_disc terminal, and the discharge control circuit 308 are connected via a diode 319 such that a current flows from the Vcc terminal side to the Vcc_disc terminal side. And, the Vcc_disc terminal is connected to the capacitor 5 outside the memory chip 30. Accordingly, while the power is being supplied to the Vcc terminal, a portion of the power supplied to the Vcc terminal is input to the capacitor 5 via the diode 319 and the Vcc_disc terminal, and the capacitor 5 stores the input power.

The drain of an enhanced n-channel MOSFET 318 as an example of a switch for discharging is connected to the group of word lines. The source of the n-channel MOSFET 318 is grounded, and the discharge control circuit 308 is connected to the gate of the n-channel MOSFET 318.

When the power interrupt occurs in the power supplied to the Vcc terminal, the wiring on the Vcc_disc terminal side is separated from the wiring on the Vcc terminal side by the diode 319. Then, the power stored in the capacitor 5 up to the time is input to the discharge control circuit 308 via the Vcc_disc terminal. The power input from the capacitor 5 to the Vcc_disc terminal corresponds to a second power. The discharge control circuit 308 that receives a signal from the power-on reset circuit 310 applies a voltage to the gate of the n-channel MOSFET 318 by using the power input to the Vcc_disc terminal. Then, the n-channel MOSFET 318 is in a conductive state, and the charges in the word line are discharged.

In this manner, the memory chip 30 is able to discharge the charges in the word line by using the power stored in the capacitor 5 even after the power supplied to the Vcc terminal is unavailable.

In addition, the Vcc terminal is connected to various circuit blocks that consume power by wiring. On the contrary, the discharge control circuit 308 is configured with the only circuit block that consumes power connected to the Vcc_disc terminal. That is, the discharge control circuit 308 receives a power supplied from a dedicated terminal different from another circuit block. Therefore, the capacitor 5 that inputs a power to the Vcc_disc terminal may be any capacitor as long as the capacitor is able to store a power sufficient to continuously drive the discharge control circuit 308 for the period required for discharging.

Figure 6:
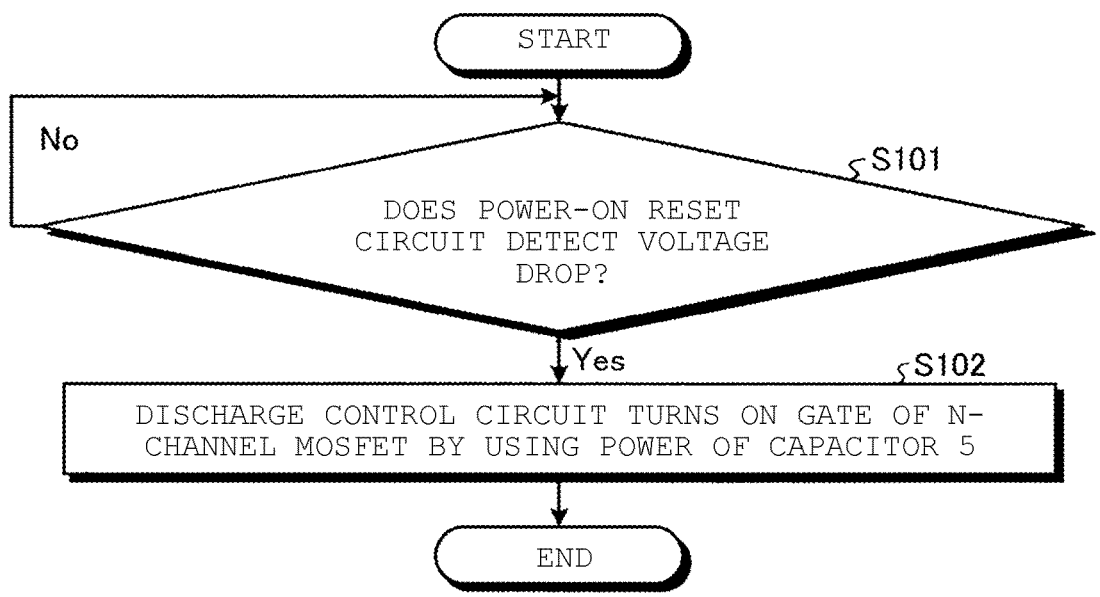
FIG. 6 is a flowchart showing an example of operations of the memory chip according to the first embodiment.

FIG. 6 is a flowchart showing an example of operations of the memory chip 30 according to the first embodiment. The power-on reset circuit 310 monitors the voltage of the Vcc terminal and determines whether or not the voltage drops (S101). The power-on reset circuit 310 repeatedly executes the process of S101 until the voltage drop of the Vcc terminal is detected (No in S101). When the power-on reset circuit 310 detects a voltage drop at the Vcc terminal (Yes in S101), the discharge control circuit 308 is notified of a predetermined signal representing a result of the process, and the discharge control circuit 308 turns on the gate of the n-channel MOSFET 318 by using the power stored in the capacitor 5 (S102). Accordingly, the charges of the word line group are discharged.

As described above, according to the first embodiment, the memory chip 30 that is the semiconductor storage device, the power supply IC 2 that generates the first power, and the memory controller 1 that operates based on the first power and transmits a command to the memory chip 30 are provided. Then, the memory chip 30 is provided with the Vcc_disc Terminal to which another power (second power) that can be used even after the voltage of the Vcc terminal drops is input in addition to the Vcc terminal that receives the input of the power (first power) from the power supply IC 2. Then the discharge control circuit 308 of the memory chip 30 is configured so as to perform discharging the charges remaining on the word line by using the power input from the Vcc_disc terminal instead of the power input from the Vcc terminal when the voltage of the Vcc terminal drops.

Therefore, even when abrupt power interrupt occurs, it is possible to discharge the charges remaining on the word line.

In addition, according to the first embodiment, the memory system 100 further includes the capacitor 5 as a first capacitor for storing the second power. The first power is input from the power supply IC 2 to the Vcc terminal, and the second power is input from the capacitor 5 to the Vcc_disc terminal.

In addition, according to the first embodiment, the memory chip 30 further includes the diode 319 that allows a portion of the first power input to the Vcc terminal to flow toward the Vcc_disc terminal. A portion of the first power is input via the diode 319 and the Vcc_disc terminal, and the capacitor 5 stores the input power as the second power.

Accordingly, it is possible to prepare another power that can be used even after the voltage of the Vcc terminal drops without requiring any special contrivance.

For example, a configuration where a second power supply that can be used to discharge the charges remaining on the word line is prepared and both the external power supply 300 and the second power supply are connected to the memory system 100 is considered. According to the first embodiment, the memory chip 30 can generate another power that can be used even after the voltage of the Vcc terminal drops. Therefore, a contrivance such as providing the second power supply is not required.

Second Embodiment

Figure 7:
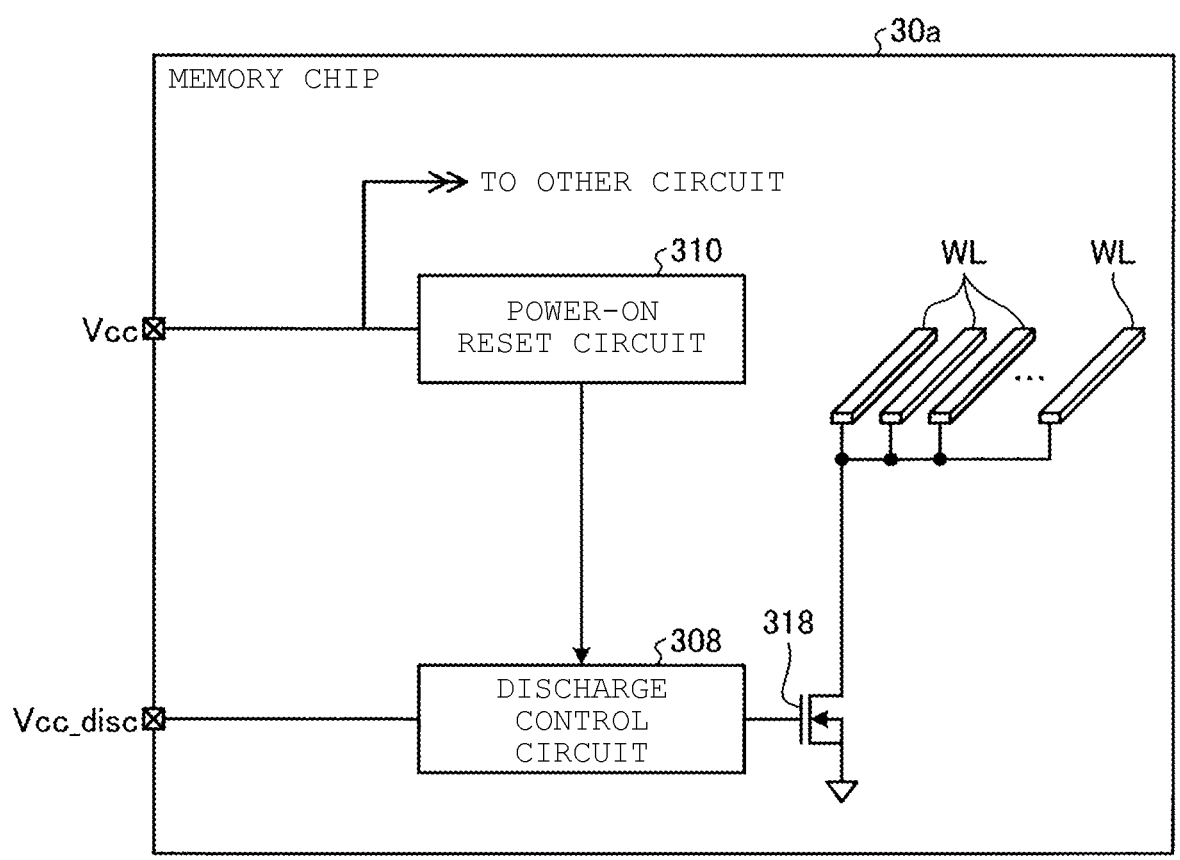
FIG. 7 is a diagram showing an example of a configuration of a memory chip according to a second embodiment.

FIG. 7 is a diagram showing an example of a configuration of a memory chip according to a second embodiment. According to the second embodiment, a memory chip 30a has a configuration in which the diode 319 is omitted from the memory chip 30 according to the first embodiment.

A power (first power) is input from the power supply IC 2 to the Vcc terminal of the memory chip 30a. Then, another power (second power) that can be used even after the voltage of the Vcc terminal drops is input to the Vcc_disc terminal of the memory chip 30a.

The configuration of a supply source of the second power may be selected freely.

Figure 8:
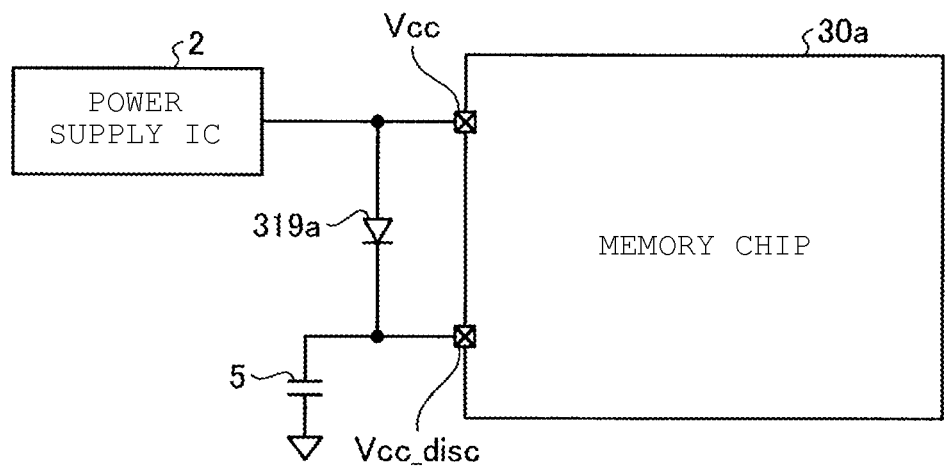
FIG. 8 is a diagram showing an example of a supply source of a second power according to the second embodiment.

For example, as shown in FIG. 8, the capacitor 5 is connected to the Vcc_disc terminal. A diode 319a that allows a portion of the power input to the Vcc terminal to flow toward the capacitor 5 is provided on the outside of the memory chip 30a. While the first power is being supplied to the Vcc terminal, a portion of the first power is input to the capacitor 5 via the diode 319a, and the capacitor 5 stores the power, so that the capacitor 5 can function as a supply source of the second power.

Figure 9:
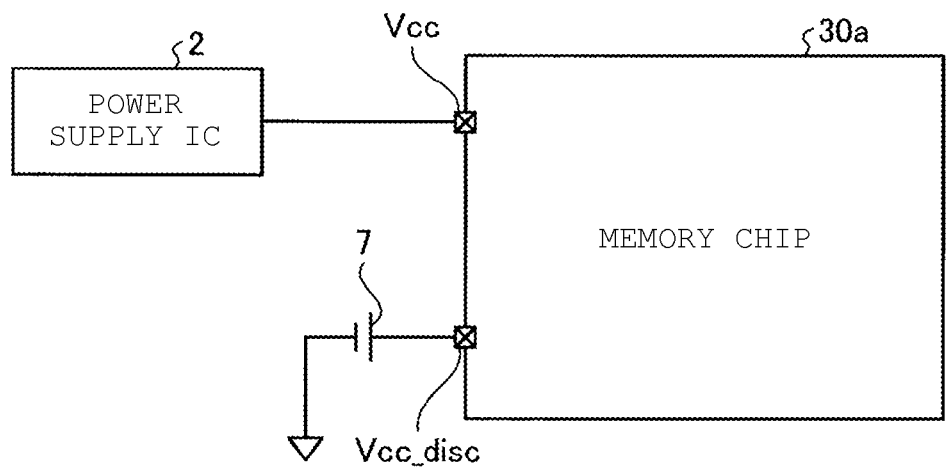
FIG. 9 is a diagram showing another example of the supply source of the second power according to the second embodiment.

Alternatively, for example, as shown in FIG. 9, a battery 7 is connected to the Vcc_disc terminal. The battery 7 may be disposed inside the memory system 100 or may be disposed outside the memory system 100. The discharge control circuit 308 is able to discharge the charges remaining on the word line by using the power from the battery 7 after the voltage drop of the Vcc terminal is detected.

Third Embodiment

Figure 10:
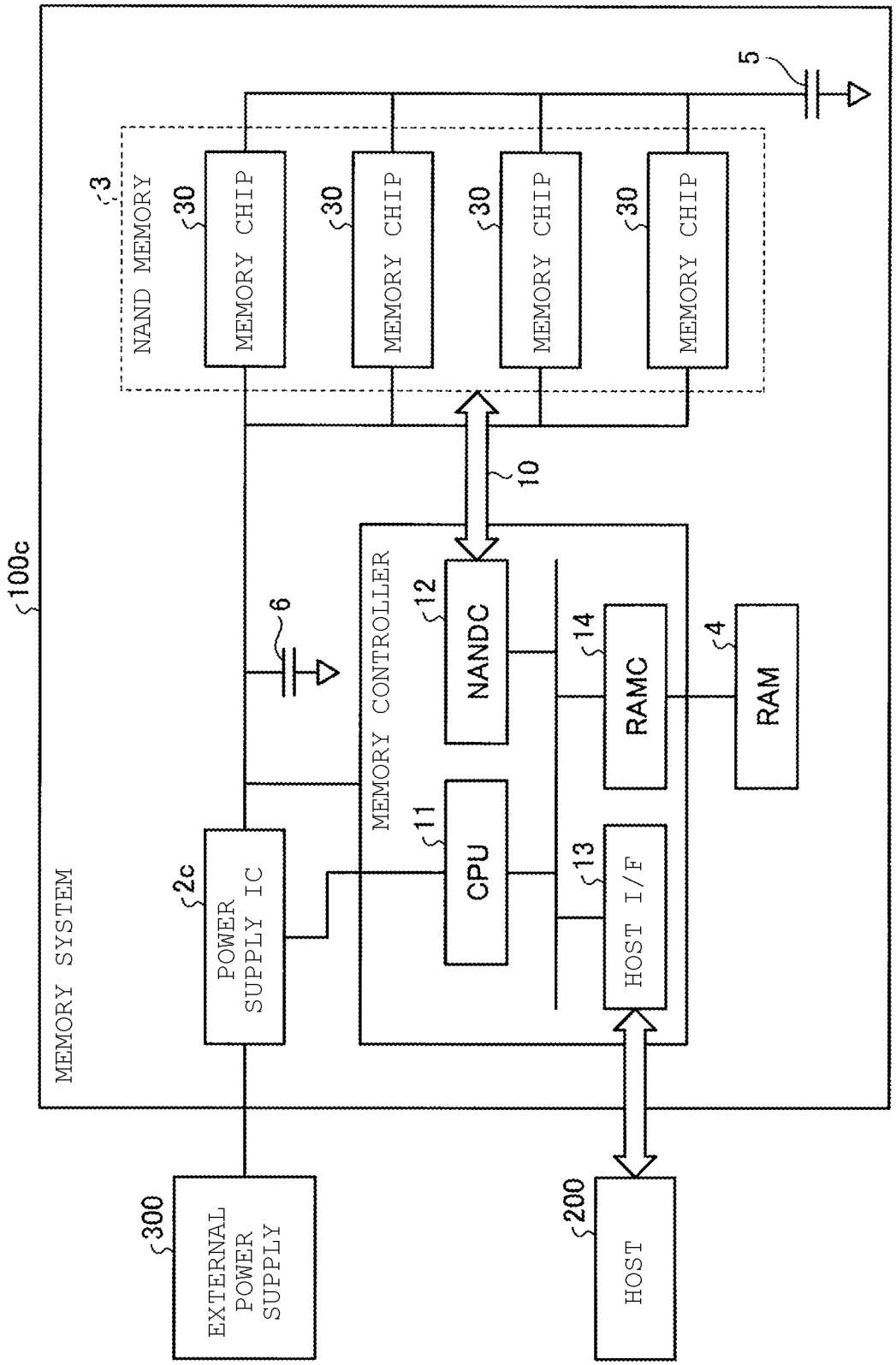
FIG. 10 is a schematic diagram showing an example of a configuration of a memory system according to a third embodiment.

FIG. 10 is a schematic diagram showing an example of a configuration of a memory system according to a third embodiment. The memory system 100c according to the third embodiment includes a power supply IC 2c that is connected to the CPU 11 by a signal line instead of the power supply IC 2 in the memory system 100 according to the first embodiment. Further, the memory system 100c according to the third embodiment includes a capacitor 6 in addition to the capacitor 5. The capacitor 6 is an example of a second capacitor.

The power supply IC 2c generates a power (first power) for driving the memory controller 1, the NAND memory 3, and the RAM 4 based on the power (third power) input from the external power supply 300. Then, the power supply IC 2c supplies the generated power to the memory controller 1, the NAND memory 3, and the RAM 4.

The power supply IC 2c monitors the voltage of the external power supply 300. Then, when the voltage drop of the external power supply 300 is detected, the power supply IC 2c transmits a predetermined signal to the CPU 11.

When the CPU 11 receives the signal from the power supply IC 2c, the protection processing is started. The protection processing is a processing of saving a portion or all of various information (data, management information, and the like) stored in the RAM 4 to the NAND memory 3.

For example, when the supply of power from the external power supply 300 is abruptly interrupted, the protection processing is started up, and various information in the RAM 4 is saved in the NAND memory 3. After that, when the power supply to the memory system 100c is resumed, the various information saved in the NAND memory 3 can be restored to the RAM 4, and the memory system 100 can be returned to the state just before the supply of power from the external power supply 300 is interrupted. The function of performing such protection processing is also referred to as power loss protection.

In the protection processing, the memory controller 1, the RAM 4, and the NAND memory 3 utilize the first power stored in the capacitor 6. Therefore, as the capacitor 6, a large-capacity capacitor capable of storing the power required for the protection processing is adopted.

Each memory chip 30 has the same configuration as the memory chip 30 according to the first embodiment.

Each memory chip 30 is able to receive the input of the first power from the power supply IC 2c at the Vcc terminal. In addition, in the protection processing, each memory chip 30 is able to receive the input of the first power from the capacitor 6 at the Vcc terminal. Each memory chip 30 is able to write various information transmitted from the memory controller 1 by the protection processing to the memory cell array 315 by using the first power from the capacitor 6.

After the protection processing is performed, the voltage of the Vcc terminal drops due to the decrease of the first power stored in the capacitor 6. Then, each memory chip 30 discharges charges remaining on the word line by using the second power stored in the capacitor 5.

FIG. 11 is a flowchart showing an example of operations of the memory system 100c according to the third embodiment. The power supply IC 2c monitors the voltage of the external power supply 300, and determines whether or not the voltage drops (S201). The power supply IC 2c repeatedly executes the process of S201 until the voltage drop of the external power supply 300 is detected (No in S201). When the power supply IC 2c detects a voltage drop of the external power supply 300 (Yes in S201), the CPU 11 is notified of a predetermined signal representing a result of the process. Then, the memory controller 1 performs the protection processing by using the power of the capacitor 6 (S202).

In the memory chip 30, the power-on reset circuit 310 monitors the voltage of the Vcc terminal and determines whether or not the voltage drops (S203). The power-on reset circuit 310 repeatedly executes the process of S203 until a voltage drop at the Vcc terminal is detected (No in S203). When the power-on reset circuit 310 detects a voltage drop at the Vcc terminal (Yes in S203), the discharge control circuit 308 is notified of a predetermined signal representing a result of the process, and the discharge control circuit 308 turns on the gate of the n-channel MOSFET 318 by using the power stored in the capacitor 5 (S204). Accordingly, the charges of the word line group are discharged.

As described above, according to the third embodiment, the capacitor 6 which is the second capacitor that stores the first power generated by the power supply IC 2c is further provided. Then, when the voltage of the third power input from the external power supply 300 drops, the first power stored in the capacitor 6 is input to the Vcc terminal.

Accordingly, even when the supply of power from the external power supply 300 is interrupted, the memory chip 30 can continue performing normal operations for a while based on the power stored in the capacitor 6. During the period, the protection processing can be executed. Then, after the protection processing is completed, it is possible to discharge the charges remaining on the word line even in a situation where the power stored in the capacitor 6 is not sufficiently left.

In addition, the third embodiment may be used in combination with the second embodiment.

As described in the first to third embodiments, each of the memory chips 30 and 30a is provided with the Vcc_disc terminal to which another power (second power) that can be used even after the voltage of the Vcc terminal drops is input in addition to the Vcc terminal that receives the input of power (first power) from the power supply IC 2. Then, the discharge control circuit 308 is configured so as to perform discharging the charges remaining on the word line by using the power input from the Vcc_disc terminal instead of the power input from the Vcc terminal when the voltage of the Vcc terminal drops.

Therefore, even when abrupt power interrupt occurs, it is possible to discharge the charges remaining on the word line.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a semiconductor storage device;
   a power supply circuit configured to generate a first power; and
   a memory controller configured to operate based on the first power and to transmit a command to the semiconductor storage device,
   wherein the semiconductor storage device includes:
   a first terminal to which the first power is input;
   a second terminal to which a second power is input, the second power can be used even after a voltage of the first terminal decreases;
   a word line connected to a control gate of a memory cell transistor, to which the command is applied;
   a first circuit configured to apply a voltage according to the command to the word line based on the first power input to the first terminal;
   a second circuit configured to discharge charge of the word line by using the second power input to the second terminal when the voltage of the first terminal decreases;
   a first capacitor configured to store the second power, wherein the first power being input to the first terminal and provided to the first circuit, and the second power is input from the first capacitor to the second terminal; and
   a second capacitor, different from the first capacitor,
   the second capacitor configured to store the first power generated by the power supply circuit,
   wherein the power supply circuit is configured to generate the first power based on a third power supplied from an external power supply, and
   when a voltage of the third power decreases, the first power stored in the second capacitor is input to the first terminal.

2. The system according to claim 1,
   wherein the semiconductor storage device further includes a diode arranged to allow a portion of the first power input to the first terminal to flow in a path toward the second terminal, and
   the portion of the first power is input to the first capacitor via the diode and the second terminal, wherein the first capacitor is configured to store the portion of the input first power as the second power.

3. A method of operating a memory system including a semiconductor storage device, the method comprising:
   generating a first power; and
   operating based on the first power and transmitting a command to the semiconductor storage device, the semiconductor storage device including a first terminal, a second terminal, and a word line connected to a control gate of a memory cell transistor;
   inputting the first power to the first terminal;
   inputting a second power to the second terminal, wherein the second power can be used even after a voltage of the first terminal decreases;
   applying a voltage according to the command to the word line based on the first power input to the first terminal;
   discharging charge of the word line by using the second power input when the voltage of the first terminal decreases;
   storing the second power in a first capacitor,
   wherein the first power is input to the first terminal, and the second power is input from the first capacitor to the second terminal;
   storing the first power in a second capacitor, that is different from the first capacitor;
   generating the first power based on a third power supplied from an external power supply; and
   when a voltage of the third power decreases, inputting the first power stored in the second capacitor to the first terminal.

4. The method according to claim 3, wherein the semiconductor storage device further includes a diode, the method further comprising:
   allowing, via the diode, a portion of the first power input to the first terminal to flow toward the second terminal;
   inputting the portion of the first power to the first capacitor via the diode and the second terminal; and
   storing in the first capacitor the portion of the input first power as the second power.

* * * * *